United States Patent [19]
Ikeda

[11] Patent Number: 5,060,235
[45] Date of Patent: Oct. 22, 1991

[54] SEMICONDUCTOR LASER ELEMENT SELECTIVELY EMITTING LIGHTS OF DIFFERENT WAVELENGTHS

[75] Inventor: Sotomitsu Ikeda, Atsugi, Japan

[73] Assignee: Canon Kabushiki Kaisha, Tokyo, Japan

[21] Appl. No.: 501,487

[22] Filed: Mar. 30, 1990

[30] Foreign Application Priority Data

Mar. 31, 1989 [JP] Japan .................................. 1-083206
Jun. 14, 1989 [JP] Japan .................................. 1-152592

[51] Int. Cl.$^5$ ............................................. H01S 3/19
[52] U.S. Cl. ...................................... 372/45; 372/23; 372/50
[58] Field of Search ........................ 372/45, 46, 50, 23

[56] References Cited

U.S. PATENT DOCUMENTS

| | | | |
|---|---|---|---|
| 4,773,076 | 9/1988 | Yamamoto et al. | 372/46 |
| 4,788,689 | 11/1988 | Tokuda et al. | 372/45 |
| 4,817,110 | 3/1989 | Takuda et al. | 372/45 |
| 4,896,328 | 1/1990 | Sekiyuchi et al. | 372/45 |
| 4,930,132 | 5/1990 | Shimizu et al. | 372/22 |
| 4,993,036 | 2/1991 | Imeda et al. | 372/50 |

FOREIGN PATENT DOCUMENTS 0312688 12/1988 Japan .................................. 372/45

*Primary Examiner*—Georgia Epps
*Attorney, Agent, or Firm*—Fitzpatrick, Cella, Harper & Scinto

[57] ABSTRACT

A semiconductor laser element selectively emitting lights differing in corresponding quantized energy from each other comprises a substrate, a laser resonator provided on the substrate and having end surfaces opposed to each other, the resonator comprising semiconductor layers including an active layer of quantum well structure and laminated on the substrate, and a plurality of electrodes juxtaposed in the direction of resonance of the resonator, the electrodes independently applying an electric current into the active layer, the end surface loss of the resonator being set so that a light corresponding to greater quantized energy may be oscillated when electric currents are applied at equal densities from the plurality of electrodes into the active layer and that a light corresponding to smaller quantized energy may be oscillated when electric currents are poured at different densities from the plurality of electrodes into the active layer.

40 Claims, 10 Drawing Sheets

SEMICONDUCTOR LASER ELEMENT SELECTIVELY EMITTING LIGHTS OF DIFFERENT WAVELENGTHS

BACKGROUND OF THE INVENTION

1. Field of the Invention

This invention relates to a semiconductor laser element useful for wavelength multiplex light information transmission, processing, recording, etc., and in particular to a semiconductor laser element emitting laser lights of different wavelengths by controlling the magnitude of an electric current poured thereinto.

2. Related Background Art

In recent years, the advance of technology in the fields of optical communications and optical information processing is striking. For example, in the field of communications, wavelength multiplex transmission and frequency modulation transmission systems are being studied for the expansion of transmission band. Also, in the field of optical recording, there are being carried out studies on the improvement in the recording density by making wavelength multiplex. Therefore, a wavelength varying function of high performance has come to be required of semiconductor laser elements used in such fields.

As a variable wavelength semiconductor laser element, one using the fundus level and the high-order level in a quantum well layer is proposed in U.S. Pat. No. 4,817,110. Also, a variable wavelength semiconductor laser element having a plurality of quantum well layers of different compositions and thicknesses provided in one and the same active layer is proposed in Japanese Laid-Open Patent Application No. 63-312688.

The principle of wavelength variation in these prior-art semiconductor lasers will hereinafter be described.

First, in the case of an active layer comprising a quantum well structure, it is well known that as the electric current applied thereto is increased, the peak of the gain in the active layer shifts from the low energy gap (long wavelength) side to the high energy gap (short wavelength) side.

In a semiconductor laser element having an active layer of such quantum well structure, when an electric current is uniformly applied to the direction of resonance, a long-wavelength light is oscillated. That is, the element emits a light corresponding to the low energy gap with the total loss in the resonator being reduced.

Also, if an electric current is non-uniformly applied to this semiconductor laser element, a short-wavelength light is oscillated. At this time, the gain becomes small in the loss area and therefore, a great deal of electric current is poured into make the gain correspondingly great in the gain area. Particularly, the gain on the short wavelength side of the loss area is very small and therefore, the electric current applied to the gain area is made so great that the total gain in the resonator becomes greatest in the short-wavelength light.

Here, the uniform application in the direction of resonance refers to a state in which an electric current is applied in at an equal current density in the direction of resonance of the light in the active layer and the light in an active waveguide in which electrons concentrate. In contrast, the non-uniform application refers to a state in which an electric current is applied into respective areas in the entire resonator at different current densities even if in a certain area, the current density is uniform per the length in the direction of resonance. Also, to make the electric currents applied to the respective areas different, a separating portion is necessary between the areas. No electric current is applied to this separating portion even during the uniform application. However, if this separating portion is of a length of 10 μm or less, when the expanse of the carrier in the active layer is considered, the electric current can be regarded as being substantially uniformly applied. Thus, the prior-art wavelength varying system has been such that a long-wavelength light is oscillated during the uniform application and a short-wavelength light is oscillated during the non-uniform application.

However, the above-described example of the prior art has suffered from a problem that the difference between the current value during the uniform application and the current value during the non-uniform application is very great. For example, the oscillation threshold value current during the non-uniform application is usually several tens of times as great as that during the uniform application. Therefore, the temperature of the element rises to thereby shorten the life of the element.

Also, in the above-described example of the prior art, the length of an absorption area is very important, and there has happened a case where if the absorption area during the non-uniform application is long, the amount of loss of the short-wavelength light becomes great and the short-wavelength light will not be oscillated however greatly the gain of the active area may be increased. This is because the gain on the short wavelength side of the loss area is remarkably reduced with a decrease in the application of electric current, while the gain on the short wavelength side of the gain area exhibits a saturation tendency with an increase in the application of electric current and therefore there may arise a state in which the loss of the short-wavelength light in the loss area cannot be completely made up for.

SUMMARY OF THE INVENTION

It is the object of the present invention to solve the above-noted problems peculiar to the prior art and to provide a variable wavelength semiconductor laser element whose oscillation wavelength can be easily controlled without the density of an electric current applied thereto being greatly varied.

The above object of the present invention is achieved by a semiconductor laser element selectively emitting lights differing in corresponding quantized energy from each other, comprising:

a substrate;

a laser resonator provided on said substrate and having end surfaces opposed to each other, said resonator comprising semiconductor layers including an active layer of quantum well structure and laminated on said substrate; and a plurality of electrodes juxtaposed in the direction of resonance of said resonator, said electrodes independently pouring an electric current into said active layer;

the end surface loss of said resonator being set so that a light corresponding to greater quantized energy may be oscillated when electric currents are poured at equal densities from said plurality of electrodes into said active layer and that a light corresponding to smaller quantized energy may be oscillated when electric currents are poured at different densities from said plurality of electrodes into said active layer.

DESCRIPTION OF THE PREFERRED EMBODIMENTS

Some embodiments of the present invention will hereinafter be described in detail with reference to the drawings.

Figure 5:
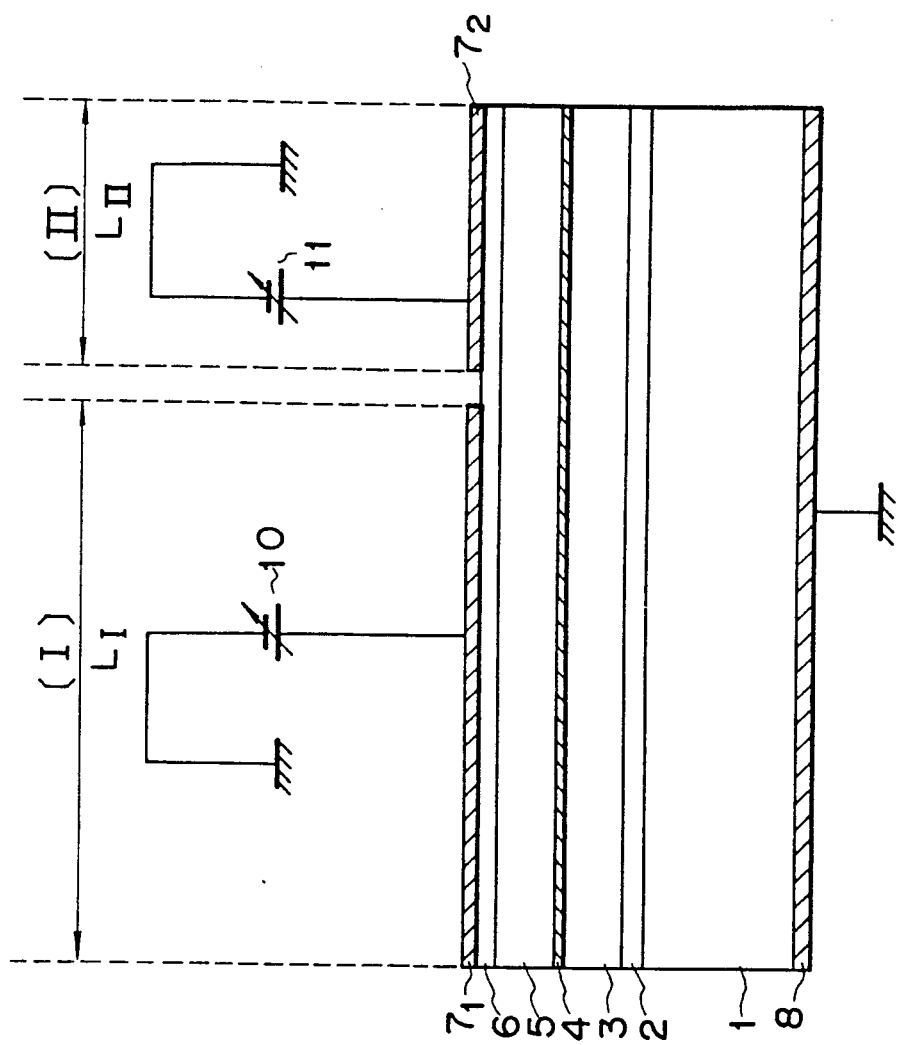
FIGS. 5A and 5B are a front view and a side cross-sectional view, respectively, showing an embodiment of the semiconductor laser element of the present invention.

As a simple example, description will first be made of a semiconductor laser element having an active layer of single quantum well (SQW) structure as shown in the energy band representation of FIG. 1. This element has two electrodes juxtaposed in the direction of resonance as shown in FIG. 5B which will be described later, and in the area [I] and the area [II] thereof, the densities of electric currents applied thereto can be independently controlled. The oscillation condition of this semiconductor laser element of analyzed as follows.

The gain g in each area is a function of the applied carrier density n and wavelength λ and therefore can be expressed as $g(n_I, \lambda_i)$. Here, when the applied electric current is I and the layer thickness of the active layer is d and the width of the active area is w and the length of the resonator is L, I=ndwL. The lengths of the respective areas are $L_I$ and $L_{II}$ and the total length of the resonator is $L \simeq L_I + L_{II}$. At this time, the oscillation condition at a certain wavelength $\lambda_i$ is a state in which $G_i = 0$ in $$G_i = \Gamma\left[\frac{L_I}{L} g(n_I, \lambda_i) + \frac{L_{II}}{L} g(n_{II}, \lambda_i)\right] - \quad (1)$$

-continued $$\alpha - \frac{1}{2L} \ln \frac{1}{Rf \cdot Rb}.$$

Here, $\Gamma$ represents the light confinement coefficient in SQW, $\alpha$ represents the internal loss in the resonator, and Rf and Rb represent the end surface reflectances respectively, of the front and rear surfaces.

Description will first be made of a case where an electric current is uniformly applied in the direction of resonance. Assuming that a light of wavelength $\lambda_2$ is oscillated, from $n_I = n_{II} = n_0$, the equation (1) becomes $$G_2 = \Gamma g(n_0, \lambda_2) - \alpha - \frac{1}{2L} \ln \frac{1}{Rf \cdot Rb}.$$

This is the equation of an ordinary semiconductor laser, and oscillation takes place when the gain becomes equal to the seem of the internal loss $\alpha$ and the end surface loss $$\frac{1}{2L} \ln \frac{1}{Rf \cdot Rb}.$$

Figure 2:
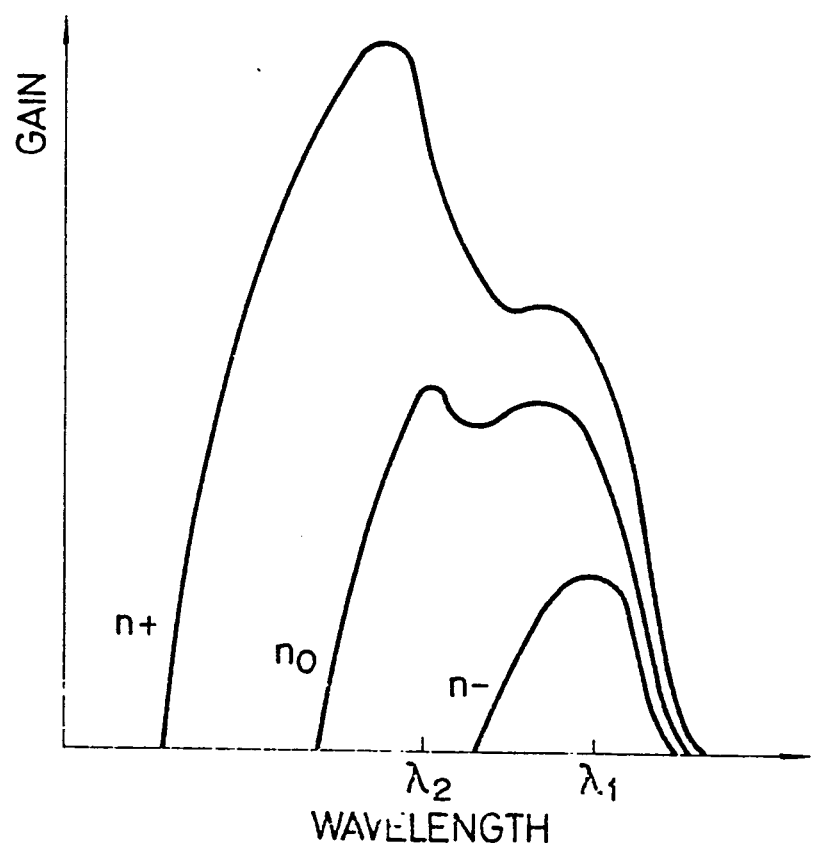
FIG. 2 is a graph showing gain curves to a wavelengths in the active layer shown in FIG. 1.

In order that the wavelength $\lambda_2$ oscillated during this uniform application may become a short wavelength corresponding to a high energy gap $Eg_2$, it is necessary to make the gain at $\lambda_2$ greater than the gain at $\lambda_1$ in the gain curve of this element shown in FIG. 2 when the wavelength corresponding to a low energy gap $Eg_1$ is $\lambda_1$. That is, $g(n_0, \lambda_1) < g(n_0, \lambda_2)$. Also, if $n_- < n_0$, the oscillation threshold gain is not yet reached here and therefore, it is necessary that $$G_1 = \Gamma g(n_-, \lambda_1) - \alpha - \frac{1}{2L} \ln \frac{1}{Rf \cdot Rb} < 0.$$

To satisfy these conditions, the following may suffice:

$$\alpha + \frac{1}{2L} \ln \frac{1}{Rf \cdot Rb} > g(n, \lambda_1) = g(n, \lambda_2).$$

That is, the total loss of the resonator may be greater than the gains at $\lambda_1$ and $\lambda_2$ are equal to each other. This is the reason why the short wavelength $\lambda_2$ corresponding to $Eg_2$ is oscillated if the internal loss or the end surface loss is great. Generally, an increase in the internal loss may cause the thermal rise in the resonator and the instability of the mode of light. Accordingly, in the present invention, this purpose is achieved by increasing the end surface loss.

Basically, use can be made of a method of shortening the length L of the resonator or a method of making the end surface reflectances Rf and Rb small.

Figure 3:
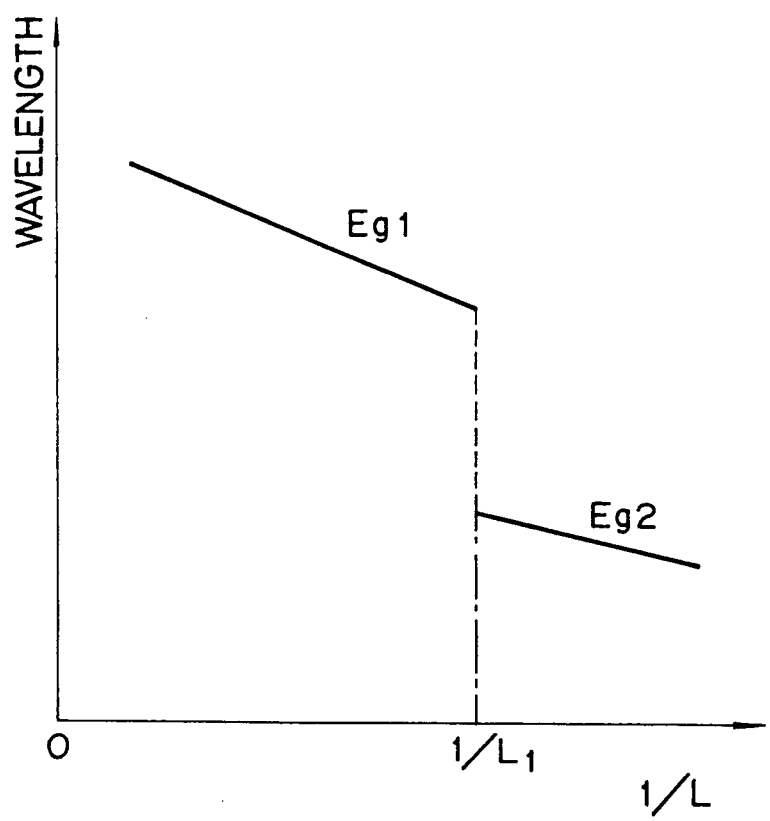
FIG. 3 is a graph showing the relation between the length of a resonator and the oscillation wavelength in an element having a quantum well structure.

FIG. 3 schematically shows a variation in the oscillation wavelength to the length L of the resonator in a semiconductor laser element having an active layer comprising a quantum well structure. What is oscillated for a light corresponding to $Eg_1$ as L becomes smaller shifts to the shot wavelength side due to the band filling effect as the threshold gain increases, and for the length $L_1$ of the resonator, the gains corresponding to $Eg_1$ and $Eg_2$ become equal to each other, and oscillation takes place at one or both of the two wavelengths, or switching of the two wavelengths takes place. When L becomes further smaller, a light corresponding to $Eg_2$ is oscillated and further shifts toward the short wavelength side.

In this manner, the oscillation wavelength is varied by the length of the resonator, and lights corresponding to different energy gaps are oscillated with $L_1$ as the boundary.

It is the present invention that makes effective use of this, and at first, the length of the resonator is set to smaller than $L_1$ so that a light corresponding to $Eg_2$ (a short-wavelength light) may be oscillated during the uniform pouring-in of an electric current. If an electric current is poured into the divided areas of this semiconductor laser at different current densities, that is, if non-uniform application of an electric current is effected in the direction of resonance, the total gain to $Eg_1$ reaches the threshold gain earlier than the total gain to $Eg_2$ in the resonator because the gain to $Eg_2$ is smaller in the loss area of small current density, and thus a light corresponding to $Eg_1$ (a long-wavelength light) is oscillated.

It is difficult to clarify the range in which the length of the resonator is short, because the threshold gain strongly depends on the quality of crystal, the end surface reflectance, the temperature used (measured), etc. So, the range of the length of the resonator of the present invention, if precisely expressed, is the range in which a light of a wavelength corresponding to a high energy gap is oscillated during the uniform application of an electric current. According to the present invention, the variation in the applied electric current during the change-over of the wavelength is small and therefore does not adversely affect the element.

Figure 4:
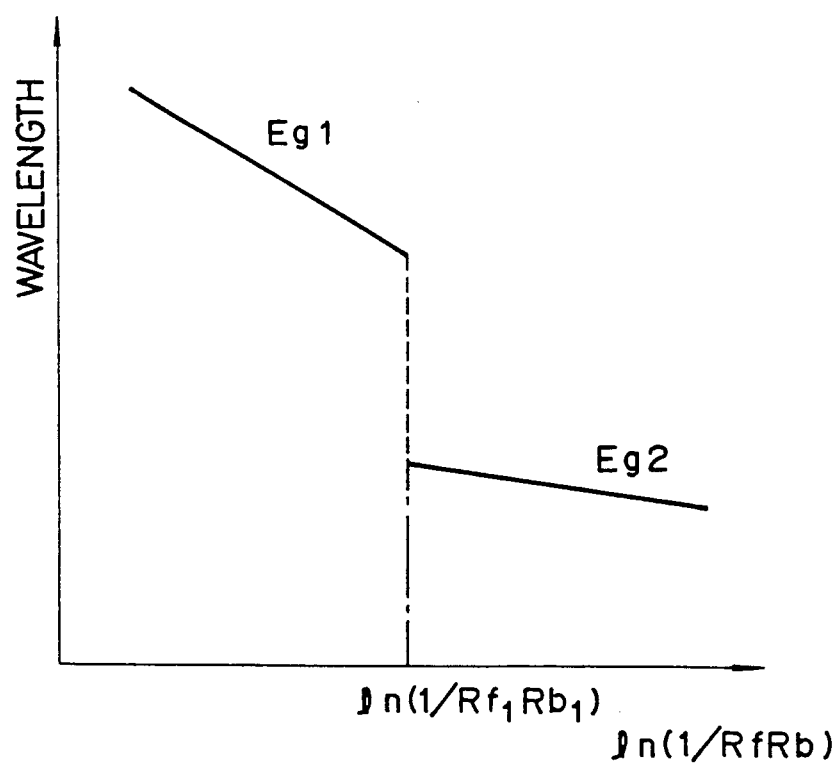
FIG. 4 is a graph showing the relation between the end surface reflectance of the resonator and the oscillation wavelength in the element having a quantum well structure.

Description will now be made of the principle of the present invention when the end surface reflectances Rf and Rb are made small. FIG. 4 schematically shows the variation in the oscillation wavelength for the end surface reflectances in a semiconductor laser element having an active layer comprising a quantum well structure. Again in this case, a behavior similar to L is exhibited, and as Rf and Rb become smaller, the light corresponding to $Eg_1$ (the long-wavelength light) shifts toward the short wavelength side. For reflectances $Rf_1$ and $Rb_1$, the gains corresponding to $Eg_1$ and $Eg_2$ become equal to each other, and oscillation takes place at one or both of the two wavelengths or switching of the two wavelengths takes place. When the reflectances become further smaller, a light corresponding to $Eg_2$ is oscillated and further shifts toward the short wavelength side.

Thus the oscillation wavelength is varied by the end surface reflectances and a light corresponding to a different energy gap is oscillated with $Rf_1$ and $Rb_1$ as the boundary. It is another technique of the present invention that makes effective use of this, and in a semiconductor laser element having a certain length of resonator, the end surface reflectances are set so that a light corresponding to $Eg_2$ may be oscillated when uniform pouring-in of an electric current is effected in the direction of resonance. This method can be easily realized by depositing a dielectric material on the end surfaces by evaporation and coating them as by sputtering. Usually, the end surface reflectances are often made smaller by about 32% than the reflectance of the cleavage plane. If non-uniform application of an electric current is effected on this semiconductor laser element in the direction of resonance, the total gain to $Eg_1$ reaches the threshold gain earlier due to an increase in the electric current poured into the gain area than the total gain to $Eg_2$ in the resonator because the gain to $Eg_2$ is small in the loss area of small current density, and thus a long-wavelength light corresponding to $Eg_1$ is oscillated.

In this case, the variation in the applied electric current during the change-over of the oscillation wavelength can be made small.

While the length of the resonator and the end surface reflectances have been independently described above, actually the present invention can be carried out also by optimizing and varying both.

In the foregoing description, $Eg_1$ and $Eg_2$ mean two of energy gaps to the quantized energy in the active layer of quantum well structure. Specifically, in the case of single quantum well structure and multiple quantum well structure having a plurality of quantum wells constant in composition and well width, $Eg_1$ and $Eg_2$ correspond to two of quantum levels $n=1, n=2, n=3, \ldots$ in the well. Also, in the case of multiple quantum well structure having a plurality of quantum wells differing in composition or well width, $Eg_1$ and $Eg_2$ mean two of several energy levels $Eg_{11}, Eg_{12}, \ldots, Eg_{21}, Eg_{22}, \ldots, Eg_{31}$ present in the active layer. Here, Eij is the jth energy level of the ith well layer.

FIGS. 5A and 5B show the schematic structure of a variable wavelength semiconductor laser element using the present invention, FIG. 5A being a cross-sectional view perpendicular to the direction of resonance, and FIG. 5B being a cross-sectional view parallel to the direction of resonance. The construction of this laser element will hereinafter be described.

The film construction is such that $n^+$-GaAs buffer layer 2 of 0.5 μm, n-$Al_{0.5}Ga_{0.5}As$ clad layer 3 of 1.5 μm, an active layer 4, p-$Al_{0.5}Ga_{0.5}As$ clad layer 5 of 1.5 μm and $p^-$-GaAs cap layer 6 of 0.5 μm are laminated on $n^+$-GaAa substrate 1 by the molecular beam epitaxial method, and An/Cr electrodes $7_1$ and $7_2$ are deposited by evaporation on the p side divided in the direction of resonance, and Au-Ge/Au electrode 8 is deposited by evaporation on the n side and is alloyed so as to make ohmic contact. The reference numerals 10 and 11 designate power sources for supplying electric currents to the electrodes $7_1$ and $7_2$, respectively.

Figure 6:
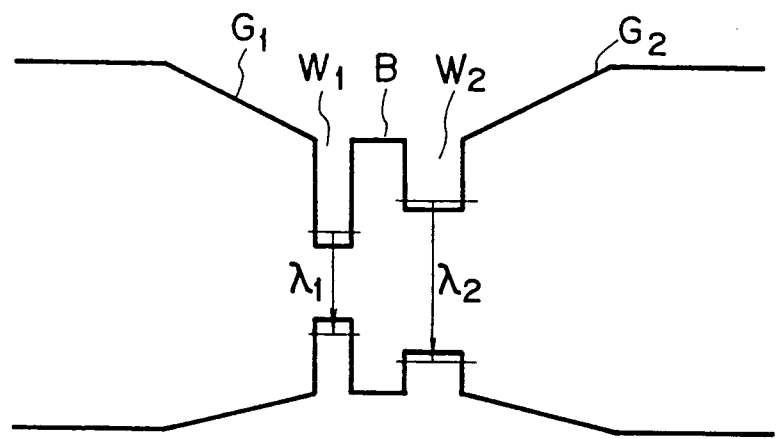
FIG. 6 shows the energy band of an active layer having two different quantum well layers.

The active layer, as shown in the energy band representation of FIG. 6, comprises a quantum well layer $W_1$ of thickness 80 Å formed of GaAs, a quantum well layer $W_2$ of thickness 160 Å formed of $Al_{0.08}Ga_{0.92}As$, and a barrier layer B of thickness 150 Å formed of $Al_{0.3}Ga_{0.7}As$ and spacing them apart from each other. Further, outside the quantum well layers, graded index-separate confinement heterostructure (GRIN-SCH) layers $G_1$ and $G_2$ of thickness 400 Å are formed by a semiconductor gradually varied in composition from $Al_{0.3}Ga_{0.7}As$ to $Al_{0.5}Ga_{0.5}As$. Confinement of light and electrons is effected by the GRIN-SCH layers. Also, the GRIN-SCH layer on the p side and the barrier layer are doped to p type.

The structure of the semiconductor laser element of the present embodiment in the lateral direction perpendicular to the direction of resonance is a ridge waveguide type structure, as shown in FIG. 5A. Here, the depth of the ridge is cut in by 1.8 μm from the upper surface thereof, and the width of the ridge is 3 μm. The both sides of the ridge have been subjected to etching work so that $Si_3N_4$ film 9 may be formed by the plasma CVD and the upper portion thereof may provide an electric current application window, whereafter the p side electrodes $7_1$ and $7_2$ are deposited by evaporation. The p side electrodes are separated into two in the direction of resonance, the full length of the resonator is 260 μm, the length of the forward electrode $7_1$ is 172 μm, the length of the rearward electrode $7_2$ is 78 μm, and the spacing between these electrodes is 10 μm.

Figure 8:
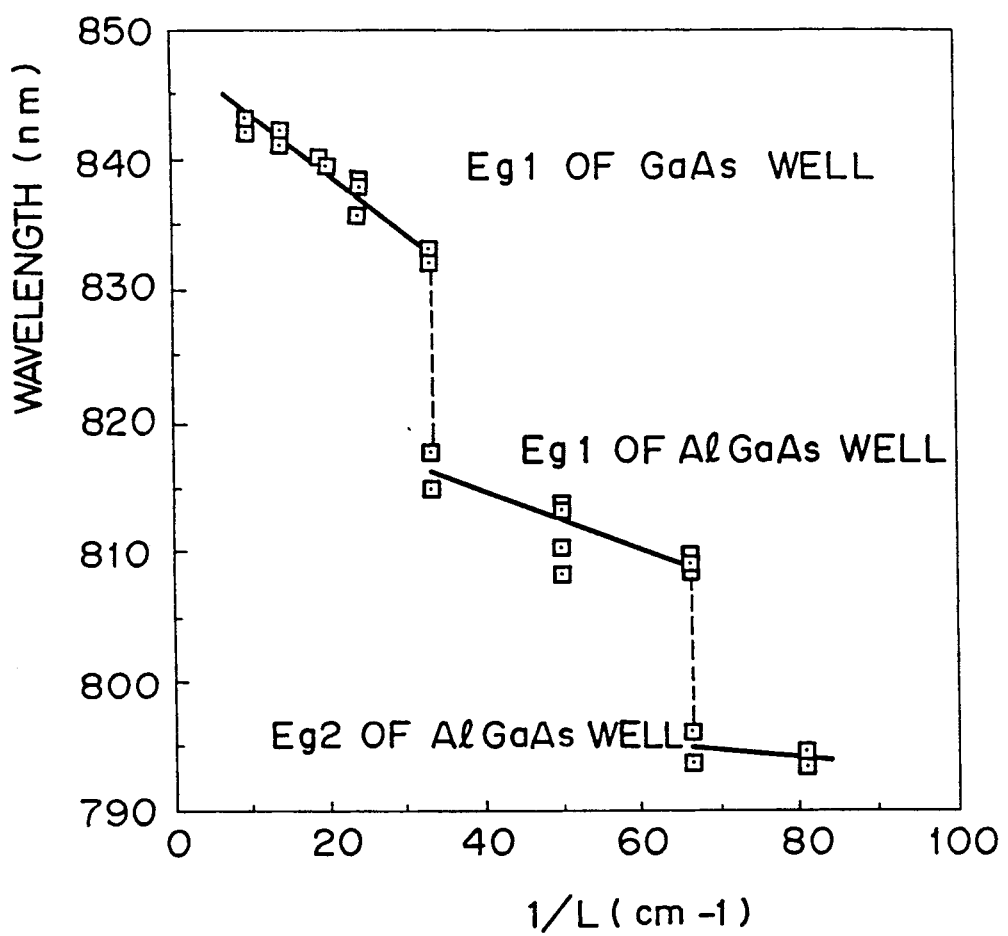
FIG. 8 is a graph showing the relation between the length of a resonator and the oscillation wavelength in the example shown in FIG. 6.

First, description will be made of the length of the resonator which is a first feature of the present invention. FIG. 8 shows the experimental values of the relation between the length of the resonator of the semiconductor laser element of the present embodiment and the oscillation wavelength. As the length of the resonator becomes shorter, the oscillation wavelength has become shorter, and at L≃300 μm and L≃150 μm, the shift of the wavelength to a discontinuous short wavelength has occurred. Thus, the shorter length of the resonator increases the end surface loss in the laser element and makes the shortening of the wavelength possible by an increase in the threshold gain.

Figure 7:
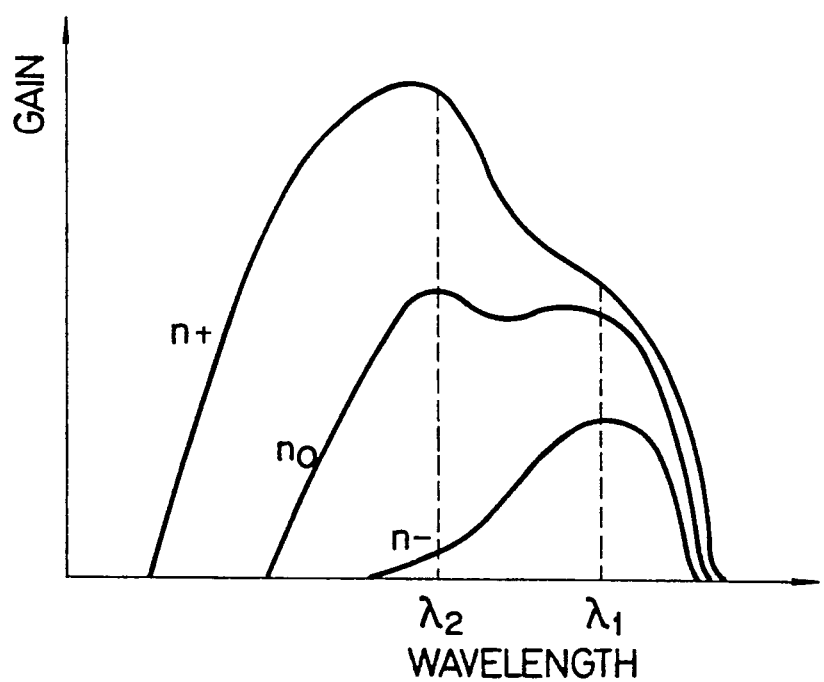
FIG. 7 is a graph showing gain curves to wavelengths in the active layer shown in FIG. 6.

In the semiconductor laser element of the present embodiment, by setting the length of the resonator to 260 μm, when an electric current has been uniformly poured in the direction of resonance, a light has been oscillated with a wavelength 815.7 mm for a current value slightly above the threshold value. This wavelength corresponds to the fondus level of the AlGaAs well layer $W_2$. The wavelength dependency of the gain resulting from adding the gains of the two well layers during this uniform pouring-in together with the light confinement coefficient taken into account is shown in FIG. 7. In the figure, there is shown the applied carrier density, which is $n_0$ during uniform pouring-in. At this time, the wavelength dependency of the gain has a maximum value at $\lambda_1$ and $\lambda_2$, but since the peak of the gain to $\lambda_2$ is greatest, a short-wavelength light $\lambda_2$ is oscillated.

Description will now be made of the behavior of the oscillation when non-uniform application of an electric current is effected into this semiconductor laser element in the direction of resonance.

In the loss area, the applied carrier density is $n_-$ and is smaller than $n_0$. As regards the wavelength dependency of the gain at this time, as shown in FIG. 7, the gain to the wavelength $\lambda_2$ is remarkably decreased as compared with that during uniform application, and becomes considerably smaller than the gain to the wavelength $\lambda_1$.

On the other hand, in the gain area, a applied carrier density $n_+$ greater than during uniform application becomes necessary to obtain a gain sufficient to make up for the decrease in the gain in the loss area. As regards the wavelength dependency of the gain at this time, as indicated by $n_+$ in FIG. 7, the gain on the short wavelength side becomes still greater than $n_0$. However, the total gain in the resonator at $\lambda_2$ becomes smaller than that at $\lambda_1$ and after all, the gain at $\lambda_1$ reaches the oscillation threshold gain earlier and thus, a long-wavelength light is oscillated.

The embodiment will hereinafter be theoretically analyzed.

As described above, the gain g is a function of the applied carrier density n and the energy gap Eg and therefore, when the wavelength corresponding to Eg is λ, the gain can be expressed as g (n, λ). When with regard to the semiconductor laser element of the present embodiment which is separated into two areas in the direction of resonance and in which an electric current can be independently poured into these areas, the lengths of the gain area and the loss area in the direction of resonance are $L_I$ and $L_{II}$, respectively, and the length of the separating portion is a sufficiently negligible length, the full length L of the resonator is approximately $L_I + L_{II}$.

Next, the gain is considered with respect to the respective well layers. The gains in the well layer $W_1$ and the well layer $W_2$ are expressed as $g_1(n_1, \lambda)$ and $g_2(n_2, \lambda)$, and the light confinement coefficients in the respective well layers are $\Gamma_1(\lambda)$ and $\Gamma_2(\lambda)$ relative to the light λ to Eg.

From this, within the resonator, the following equation is satisfied relative to a light of $\lambda_i$:

$$G_i = \frac{L_I}{L} \{\Gamma_1(\lambda_i) \cdot g_1(n_1, \lambda_i) + \Gamma_2(\lambda_i) \cdot g_2(n_2, \lambda_i)\} + \qquad (2)$$

$$\frac{L_{II}}{L} \{\Gamma_1(\lambda_i) \cdot g_1'(n_1', \lambda_i) + \Gamma_2(\lambda_i) \cdot g_2'(n_2', \lambda_i)\} - \alpha_i -$$

$$\frac{1}{2L} \ln \frac{1}{Rf \cdot Rb}$$

where $\alpha_i$ represents the loss of the light of wavelength $\lambda_i$ in the resonator, and Rf and Rb represent the end surface reflectances of the front surface and the rear surface, respectively. The wavelength dependency of Rf and Rb is small and therefore is neglected here. G=0 is the oscillation condition. In the equation (2), during the uniform application of an electric current, the contents in { } of the first and second terms of the right side become equal to each other, and the carrier change in the gains of the two quantum well layers can be considered.

When during uniform application, the applied carrier is $n_0$, the carriers applied to the respective well layers $W_1$ and $W_2$ are $n_1$ and $n_2$.

With regard to $\lambda_1$, the following equation is available:

$$G_1 = \Gamma_1(\lambda_1) \cdot g_1(n_1, \lambda_1) + \Gamma_2(\lambda_1) \cdot g_2(n_2, \lambda_1) - \alpha_1 -$$

$$\frac{1}{2L} \ln \frac{1}{Rf \cdot Rb}$$

However, there is no gain of $\lambda_1$ by the well layer $W_2$ and therefore, $g_2(n_2, \lambda_2) = 0$. Likewise, with regard to $\lambda_2$, the following equation is available:

$$G_2 = \Gamma_1(\lambda_2) \cdot g_1(n_1, \lambda_2) + \Gamma_2(\lambda_2) \cdot g_2(n_2', \lambda_2) - \alpha_2 -$$

$$\frac{1}{2L} \ln \frac{1}{Rf \cdot Rb}$$

The wavelength dependency of the light confinement coefficient depends on the wavelength dispersion of the refractive index, but for simplicity, it is defined as $\Gamma_1(\lambda_1) \simeq \Gamma_1(\lambda_2)$ and $\Gamma_2(\lambda_2) \simeq \Gamma_2(\lambda_2)$. Also, the internal loss is defined as $\alpha_1 \simeq \alpha_2$. At this time, $G_1$ is determined by $g_1(n_1, \lambda_1)$, while $G_2$ is determined by $g_1(n_1, \lambda_2)$ and $g_2(n_2, \lambda_2)$ and therefore, if $n_0$ increases, $G_2 > G_1$. Here, when the end surface loss is great, that is, L is small, or when Rf and Rb are small, the state of $G_1 < 0 = G_2$ occurs. At this time, $\lambda_2$ is oscillated.

The oscillation wavelength $\lambda_i$ when the carrier is non-uniformly applied in the direction of resonance will now be considered. When the carrier is applied into the gain area and the loss area at the carrier densities of $n_+$ and $n_-$, respectively, electric currents of densities $n_1$, $n_2$ for the gain area and $n_1'$, $n_2'$ for the absorption area are applied into the quantum well layers $W_1$ and $W_2$, respectively. Again here, assuming that the variations in $\Gamma_1$, $\Gamma_2$ and $\alpha$ by the wavelength are small, $$G_i = \frac{L_I}{L}\{\Gamma_1 \cdot g_1(n_1, \lambda_i) + \Gamma_2 \cdot g_2(n_2, \lambda_i)\} +$$

$$\frac{L_{II}}{L}\{\Gamma_1 \cdot g_1'(n_1', \lambda_i) + \Gamma_2 \cdot g_2'(n_2', \lambda_i)\} - \alpha -$$

$$\frac{1}{2L} \ln \frac{1}{Rf \cdot Rb}$$

At $\lambda_i = \lambda_2$, $g_1'(n_1', \lambda_2) < 0$ and $g_2'(n_2', \lambda_2) \simeq 0$ and therefore, $G_i < 0$ if $g_1(n_1, \lambda_2)$ and $g_2(n_2, \lambda_2)$ cannot be made very great.

On the other hand, at $\lambda_i = \lambda_1$, $g_1'(n_1', \lambda_1) > 0$ and $g_2'(n_2', \lambda_1) = 0$ and therefore, $g_1(n_1, \lambda_1)$ and $g_2(n_2, \lambda_1)$ can be made sufficiently great to readily satisfy $G_1 = 0$.

Thus, the well layer $W_1$ forming a small energy gap exhibits a great loss to the short-wavelength light $\lambda_2$ in the loss area during non-uniform pouring-in and therefore, the oscillation of the long-wavelength light takes place more readily.

Figure 9:
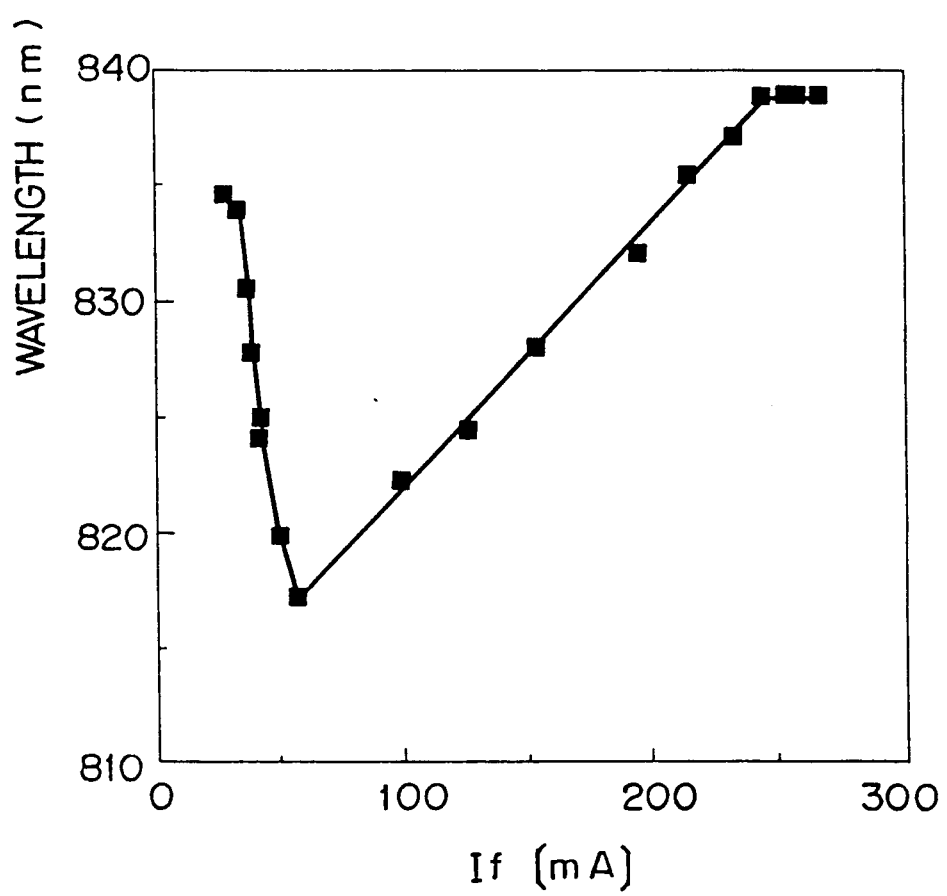
FIG. 9 is a graph showing the relation between the forward side poured-in electric current and the oscillation wavelength in the example shown in FIG. 6.

In the foregoing, extremely the two wavelengths $\lambda_1$ and $\lambda_2$ have been described, but actually, as can be seen in FIG. 7 from the variation in the gradient of the gain curve between $\lambda_1$ and $\lambda_2$ relative to the wavelength when the amount of applied carrier is varied, oscillation is possible at wavelength between $\lambda_1$ to $\lambda_2$ at which the total gain in the resonator becomes greatest. The wavelength in the threshold condition obtained by an experiment is shown in FIG. 9. When during uniform application, an electric current of $I_f = 50$ mA and an electric current of $I_b = 23$ mA were applied into the front area ($L_f = 172$ μm) and the rear area ($L_b = 78$ μm), respectively, the threshold value was reached and oscillation took place at the shortest wavelength of 815.7 nm.

When electric currents were non-uniformly applied, that is, an electric current of $I_f = 30$ mA was applied into the front area as the loss area and an electric current of $I_b = 130$ mA was applied into the rear area as the gain area, oscillation took place at $\lambda = 834.7$ nm in the threshold condition. Conversely, when an electric current of $I_f = 245$ mA was applied into the front area as the gain area and an electric current of $I_b = 3.5$ mA was applied into the rear area as the loss area, oscillation took place at a wavelength of 838.9 nm. Also, when the electric current applied into the front area was variously varied, as shown in FIG. 9, the shortest-wavelength light was oscillated during uniform application, and the wavelength became longer with an increase in non-uniformity and continuously varied between the wavelengths corresponding to Eg of the two well layers $W_1$ and $W_2$. This is because as described above, the wavelength at which the total gain in the resonator is selectively oscillated due to the difference in the gain curve to wavelength between the loss area and the gain area.

Figure 10:
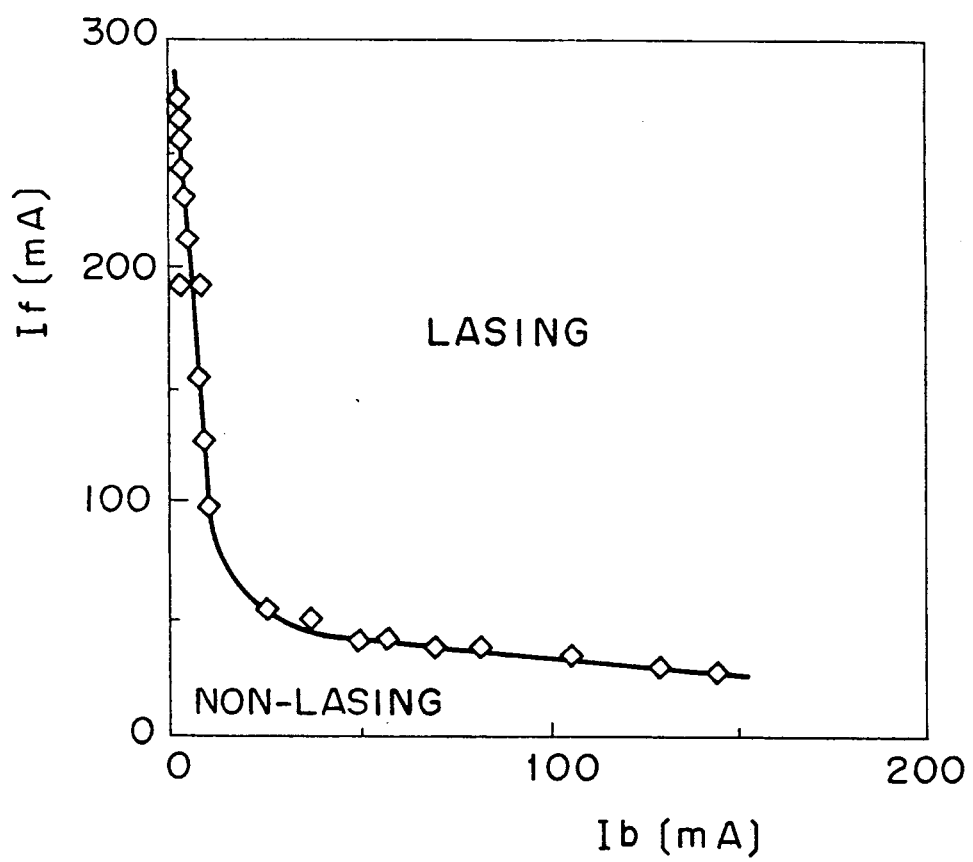
FIG. 10 is a graph showing the relation between the forward side poured-in electric current and the rearward side poured-in electric current in the oscillated state of the example shown in FIG. 6.

FIG. 10 shows the relation between the electric current $I_f$ applied into the front area and the electric current $I_b$ applied into the rear area in the oscillation threshold condition of the semiconductor laser element of the present embodiment.

It is seen from FIG. 10 that if one of the two areas is the loss area, the other area is the gain area which makes up for it. Considering FIG. 10 in conjunction with FIG. 9, it is seen that whichever area is the loss area, it is possible to vary the wavelength. Thus, by setting the length of the resonator to a certain length or less so that a short-wavelength light corresponding to a higher energy gap of the quantum well layers may be oscillated during uniform application, even when non-uniform application is effected, the oscillation wavelength can be made longer without so greatly varying the current value, and a good variable wavelength semiconductor laser element can be realized.

In the above-described experiment, the wavelength became longer while continuously exhibiting the wavelength shift of the Fabry-Perot mode as the non-uniformity of the application of the electric current increased, and the wavelength could be varied from 815.7 nm to 838.9 nm.

Further, by varying the setting of the quantum well layers and barrier layer in the active layer, the length of the resonator and the lengths of the gain area and the loss area, only a particular wavelength on the gain curve can be selectively oscillated and it is also possible to vary the wavelength discontinuously. Also, according to a certain condition, it is also possible to change over two wavelengths corresponding to two energy gaps. For example, as a method of using the semiconductor laser element of the present embodiment, it becomes possible to preset electric currents to be applied into two areas, and change over them to thereby freely oscillate wavelengths differing in terms of time from an element.

In the embodiment described above, description has been made with respect only to the length L of the resonator, but by making the end surface reflectances Rf and Rb as well as L in the aforementioned equations (1) and (2), the threshold gain can be increased. This method is effective as a method of selectively oscillating a short-wavelength light during uniform application. In this case, Rf and Rb can be easily decreased by coating the end surfaces with a dielectric material or the like. Also, for a high output and a high oscillation efficiency, Rb > Rf is desirable, but the present invention is effective even if Rb ≦ Rf.

Figure 1:
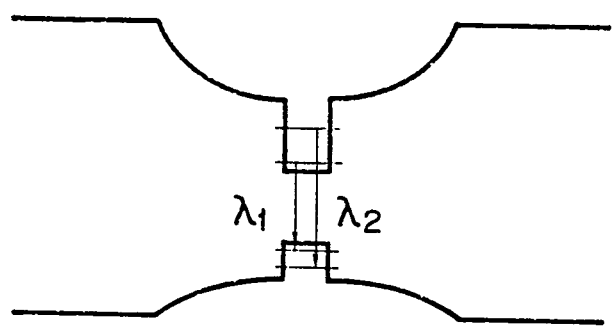
FIG. 1 shows the energy band of an active layer having a single quantum well layer.

The film construction shown in FIGS. 5A and 5B can also be applied to a semiconductor laser element in which as shown in FIG. 1, the active layer is of SQW structure. The gain curve of an element having the structure as shown in FIG. 6 assumes a form as shown in FIG. 7 wherein two gain curves of the element of SQW structure shown in FIG. 2 are added together. However, the variations in the gain curve for the variations in the applied carrier density in these figures exhibit substantially similar behaviors.

Thus, again in a semiconductor laser element having an active layer of SQW structure, the wavelength variation by the present invention is possible. Of course, entirely similar description holds true in the case of multiple quantum well structure having a plurality of well layers constant in composition and well width. Also, the GRIN-SCH layer, in the case of the quantum well structure, is effective for realizing a low threshold value, but in the absence of it, the present invention is also applicable.

Figure 11A:
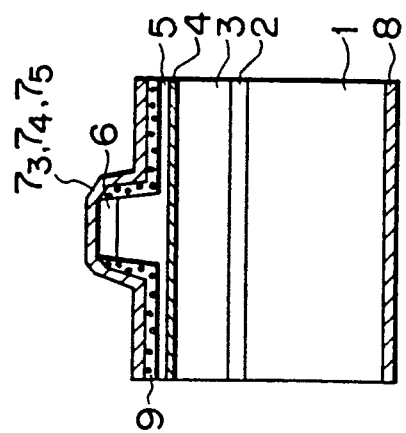
FIGS. 11A to 13 are schematic cross-sectional views showing further embodiments of the present invention.
Figure 11B:
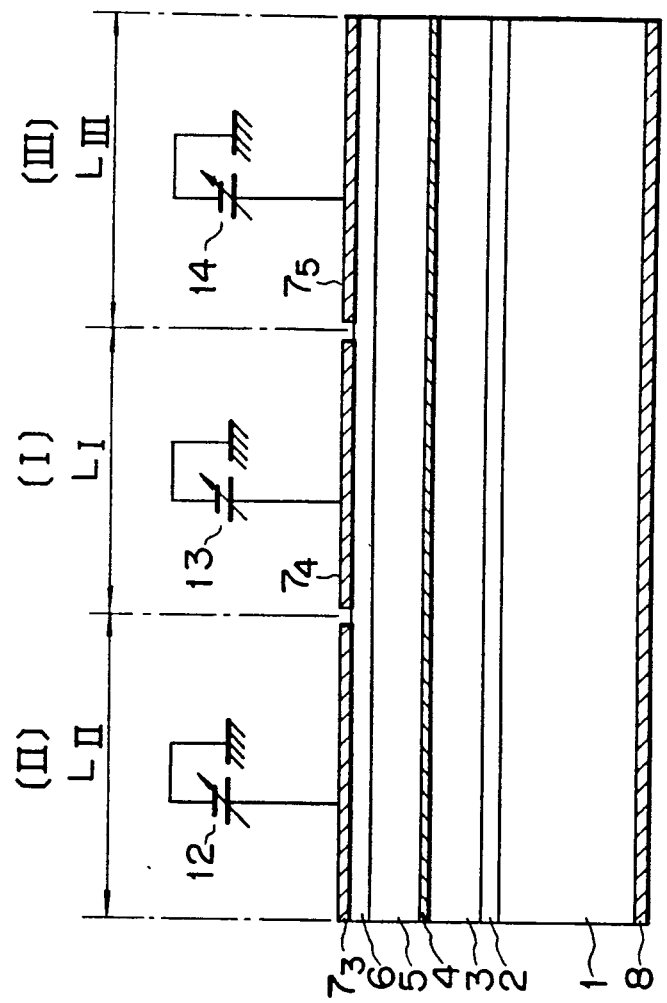

FIGS. 11A and 11B show an embodiment of a semiconductor laser element in which a resonator is divided into three areas in the direction of resonance. FIG. 11A is a cross-sectional view perpendicular to the direction of resonance, and FIG. 11B is a cross-sectional view parallel to the direction of resonance. The film construction of this embodiment is entirely similar to that of the embodiment shown in FIGS. 5A and 5B. The structure of an active layer 4 is also similar to the example shown in FIG. 6. Accordingly, in FIGS. 11A and 11B, members identical to those in FIGS. 5A and 5B are given identical reference numerals and need not be described in detail.

In the present embodiment, the resonator is divided into three areas, i.e., a loss are [II], a gain area [I] and a regulation area [III], in the direction of resonance. Electrodes $7_3$, $7_4$ and $7_5$ are provided on the upper surfaces of these areas [II], [I] and [III], respectively. The reference numerals 12, 13 and 14 designate variable voltage sources for supplying electric currents to the electrodes $7_3$, $7_4$ and $7_5$, respectively. The full length of the resonator is 260 $\mu$m, the length of the electrode $7_3$ is 60 $\mu$m, the length of the electrode $7_4$ is 60 $\mu$m, the length of the electrode $7_5$ is 120 $\mu$m, and the spacing between the adjacent electrodes is 10 $\mu$m.

When the relation between the length of the resonator and the oscillation wavelength in the present embodiment was examined, there was obtained a result shown in FIG. 8 which was the same as that of the aforedescribed embodiment. That is, as the length of the resonator became shorter, the oscillation wavelength became shorter, and at $L \simeq 300$ $\mu$m and $L \simeq 150$ $\mu$m, the shift of the wavelength to the discontinuous short wave took place. Thus, it was possible to increase the end surface loss in the laser element and increase the threshold gain to thereby make the wavelength shorter.

In the semiconductor laser element of the present embodiment, the length of the resonator was set to 260 $\mu$m, whereby when an electric current was uniformly poured in the direction of resonance, oscillation took place at a wavelength of 815.7 nm by a current value slightly above the threshold value. This wavelength corresponds to the fundus level of AlGaAs well layer $W_2$. The wavelength dependency of the gain of this semiconductor laser, as in the aforedescribed embodiment, is shown in FIG. 7. In the figure, the applied carrier density is shown, and it is $n_0$ during uniform application. At this time, the wavelength dependency of the gain has a maximum value at $\lambda_1$ and $\lambda_2$, but since the peak of the gain to $\lambda_2$ is greatest, a short-wavelength light $\lambda_2$ is oscillated.

Description will now be made of the behavior of the oscillation when an electric current is uniformly applied into this semiconductor laser element.

In the loss area [II], the applied carrier density is $n_-$ and is smaller than $n_0$. As regards the wavelength dependency of the gain at this time, as shown in FIG. 7, the gain to the wavelength $\lambda_2$ remarkably decreases as compared with that during uniform application, and becomes considerably smaller than the gain to $\lambda_2$.

On the other hand, in the gain area [I], a applied carrier density $n_+$ greater than that during uniform pouring-in become necessary to obtain a gain sufficient to make up for the decrease in the gain in the loss area. As regards the wavelength dependency of the gain at this time, as indicated by $n_+$ in FIG. 7, the gain on the short wavelength side becomes still greater than $n_0$. However, the total gain in the resonator at $\lambda_2$ becomes smaller than that at $\lambda_1$, and after all, the total of the gains of the areas [I] and [II] which are wavelength control portions becomes greatest at $\lambda_1$.

Thus, if in a state in which a wavelength at which oscillation is ready to take place by the electric currents applied into the areas [I] and [II] has been determined, an electric current of slightly smaller density than the applied carrier density $n_0$ during uniform is applied to the regulation area [III] and the gains to the wavelengths $\lambda_1$ and $\lambda_2$ are set to an equal degree, a wavelength selected by the electric currents poured into the areas [I] and [II] is oscillated.

Actually, the control of the light output will become more accurate if fine adjustment of the electric currents applied to the areas [I] and [II] is effected, instead of the control of only the electric current applied to the area [III]. This is because an increase in the gain of the area [III], like the area [I], affects the increase in the gain on the short wavelength side.

In the present invention, there are three portions into which electric currents are applied and therefore, there is a degree of freedom which can easily cope with the requirement for both of wavelength control and light output control. According to the experiment, during uniform application, the electric current $I_{II}=17$ mA poured into the area [II], the electric current $I_I=17$ mA poured into the area [I] and the electric current $I_{III}=34$ mA poured into the area [III] became the threshold current and oscillation took place at 815.7 nm, and if the applied electric currents were uniformly increased, the light output increased.

On the other hand, non-uniform application was effected and oscillation took place at 834.7 nm with the electric current $I_{II}=10$ mA applied to the area [II], the electric current $I_I=100$ mA applied to the area [I] and the electric current $I_{III}=30$ mA poured into the area [III] as the threshold value, and as $I_{III}$ was increased, the light output increased while the wavelength was kept substantially constant.

Also, when the ratio between the densities of the electric currents applied to the areas [I] and [II] was varied, the oscillation wavelength continuously varied between about 816 nm and 839 nm.

Thus, the oscillation wavelength was determined by the electric currents applied to the areas [I] and [II], and the light output could be controlled by the electric current applied to the area [III].

Also, by varying the setting of the quantum well layers and barrier layer in the active layer, the length of the resonator and the lengths of the gain area and the loss area, only a particular wavelength on the gain curve can be selectively oscillated and it is possible to vary the wavelength discontinuously. Also, according to a certain condition, it is possible to change over only two wavelengths corresponding to two energy gaps.

Again in the present embodiment, the end surfaces of the resonator can be coated with a reflection preventing layer comprising dielectric material film and the end surface loss of the resonator can be regulated.

As methods of using the semiconductor laser element of the present embodiment, there are conceivable a method of use in which the light output is varied at a certain oscillation wavelength, and a method of use in which the oscillation wavelength is varied at a certain light output. In this case, the simultaneous control of the wavelength and the light output is easy because there are three different areas.

Also, in the semiconductor laser element having the active layer of SQW structure as shown in FIG. 1, the resonator can be divided into three areas as shown in FIG. 11B. The oscillation conditions in such case will hereinafter be described.

The gain g in each area is a function of the applied carrier density n and the wavelength $\lambda$ and therefore can be expressed as g ($n_i$, $\lambda_i$). The lengths of the respective areas are $L_I$, $L_{II}$ and $L_{III}$, and the full length of the resonator is $L \simeq L_I + L_{II} + L_{III}$.

At this time, the oscillation condition at a certain wavelength $\lambda i$ is a state in which $Gi=0$ in $$Gi = \Gamma\left[\frac{L_I}{L}g(n_I\cdot\lambda i) + \frac{L_{II}}{L}\cdot g(n_{II}\cdot\lambda i) + \frac{L_{III}}{L}\cdot g(n_{III}\cdot\lambda i)\right] - \alpha - \frac{1}{2L}\ln\frac{1}{Rf\cdot Rb} \quad (3)$$

where $\Gamma$ represents the light confinement coefficient in SQW, $\alpha$ represents the internal loss in the resonator, and Rf and Rb represent the end surface reflectances of the front and rear surfaces, respectively.

Description will first be made of a case where an electric current is uniformly applied in the direction of resonance. Assuming that a light of $\lambda_2$ is oscillated, from $n_I=n_{II}=n_{III}=n_0$, the equation (3) becomes $$G2 = \Gamma g(n_0, \lambda_4) - \alpha - \frac{1}{2L}\ln\frac{1}{Rf\cdot Rb}$$

This is the equation of an ordinary semiconductor laser, and oscillation takes place when the gain becomes equal to the sum of the internal loss $\alpha$ and the end surface loss $$\frac{1}{2L}\ln\frac{1}{Rf\cdot Rb}.$$

In order that the wavelength $\lambda_2$ oscillated during this uniform application may become a short wavelength corresponding to a high energy gap $E_{g2}$, when the wavelength corresponding to a low energy gap $E_{g1}$ is $\lambda_1$, it is necessary that in FIG. 2.

$$g(n_0, \lambda_1) < g(n_0, \lambda_2).$$

Also, if $n_- < n_0$, it is necessary that $$G1 = \Gamma g(n_-, \lambda_1) - \alpha - \frac{1}{2L}\ln\frac{1}{Rf\cdot Rb} < 0.$$

To satisfy these conditions, the following need only be established:

$$\alpha + \frac{1}{2L}\ln\frac{1}{Rf\cdot Rb} > g(n, \lambda_1) = g(n, \lambda_2).$$

That is, again in the present embodiment, a short wavelength corresponding to $E_{g2}$ can be oscillated by making the end surface loss great. To make the end surface loss great, the length L of the resonator can be short or the end surface reflectances Rf and Rb can be made small, as previously described. Accordingly, again in the present embodiment, the relation between the length L of the resonator and the oscillation wavelength and the relation between the end surface reflectances Rf, Rb and the oscillation wavelength can be represented as schematically shown in FIGS. 3 and 4.

Assuming that the gain curves in the present embodiment are those shown in FIG. 2, when $n_I\sim n_-$ and $n_{II}\sim n_+$, in the area [I], $g(n_I, \lambda_2) << g(n_I, \lambda_1)$, and
in the area [II], $g(n_{II}, \lambda_2) > g(n_{II}, \lambda_1)$.

Where the resonator loss is determined so that oscillation may take place when in the area [III], $g(n_{III}, \lambda_2)\simeq g(n_{III}, \lambda_1)$, $G2 < G1 = 0$ and oscillation takes place at a wavelength of $\lambda_1$. Thus, in the loss area, the gain to $\lambda_2$ is set to remarkably smaller than that to $\lambda_1$, with a result that G1 to $\lambda_1$ becomes great. In this manner, the oscillation wavelength is determined by the use of the electric currents applied to the areas [I] and [II], while a bias current is formed flatly so that in the area [III], the gain at $\lambda_1$ and $\lambda_2$ or at a wavelength therebetween may not depend very much on the wavelength, whereby a light of a wavelength at which the gain is greatest in the areas [I] and [II] can be selected. In the area [III], light can be amplified to thereby control the light output. In this case, if the length of the area [III] is long as compared with the lengths of the areas [I] and [II], the gain can be made great by a small difference in the applied electric current without much varying the wavelength dependency of the gain distribution and therefore, the control of the light output is easy.

That is, by using the laser element of the present embodiment, it has become possible to separate the control portion for the oscillation wavelength and the control portion for the light output from each other in the direction of resonance. In addition, the structural parameters for the control of the light output and wavelength have increased and it has become easy to vary the oscillation wavelength while keeping the light output constant or to vary the light output while keeping the oscillation frequency constant.

A further advantage of the laser element of the present embodiment is that it is not necessary that as in the prior art, the gain in the wavelength control areas ( [I] and [II]) be increased until it becomes equal to the oscillation threshold gain and therefore the difference between the electric currents applied to the areas [I] and [II] may be small.

Also, when the laser device of the present invention is to be modulated at a high speed, the areas [I] and [II] of the wavelength control portion can be biased to a constant electric current so that a desired wavelength may be oscillated, and the area [III] which is the light output control portion can be modulated. By doing so, it is possible to suppress the production of the noise of a transient wavelength variation occurring when the areas [I] and [II] are modulated.

Another embodiment of the setting of the length L of the resonator which is a feature of the present invention will now be shown.

Figure 12:
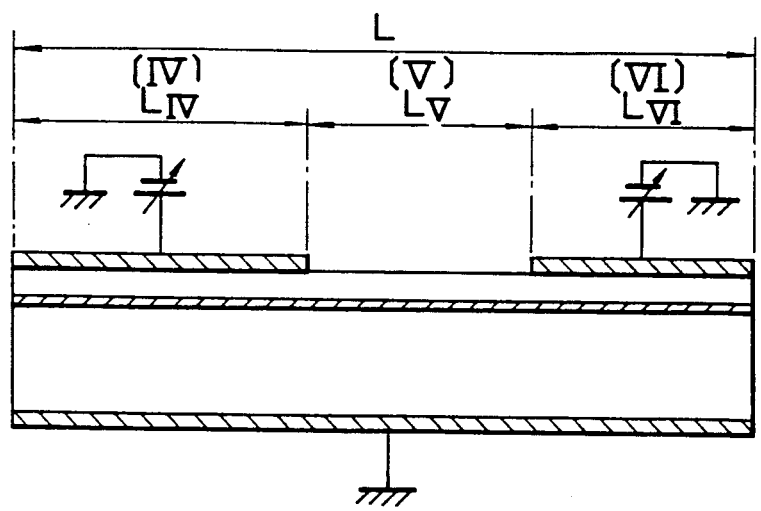

FIG. 12 shows an embodiment in which in the direction of resonance, there are areas [IV] and [V] into which electric currents are applied and there is a waveguide loss area [VI] therebetween.

The lengths of the respective areas are $L_{IV}$, $L_V$ and $L_{VI}$, and the full length L of the resonator is $L=L_{IV}+L_V+L_{VI}$. If $L_{VI}$ is of the order of several $\mu$m, $L_{VI}$ is negligibly small when the expanse of the carrier in the interior is considered and therefore, the previously shown embodiment can explain this embodiment. However, if $L_{VI}$ is greater than about 10 $\mu$m, the area [VI] acts as an absorption area on light with a result that the total loss in the resonator is increased to thereby increase the oscillation threshold gain. This embodiment is grasped as an element in which a loss area is provided in advance within the resonator. That is, in this case, the full length of the resonator is greater than the length of a resonator which oscillates a short wavelength corresponding to a high energy gap during uniform pouring-in, and likewise, a short-wavelength light is oscillated when a carrier is applied to the areas [IV]

and [V] with the same current density. When a carrier is applied to areas [IV] and [V] at different current densities, a long-wavelength light is oscillated.

Such an absorption area may exist anywhere in the direction of resonance, and if it is near the end surface, it will provide a window structure and be suitable for a higher output.

Figure 13:
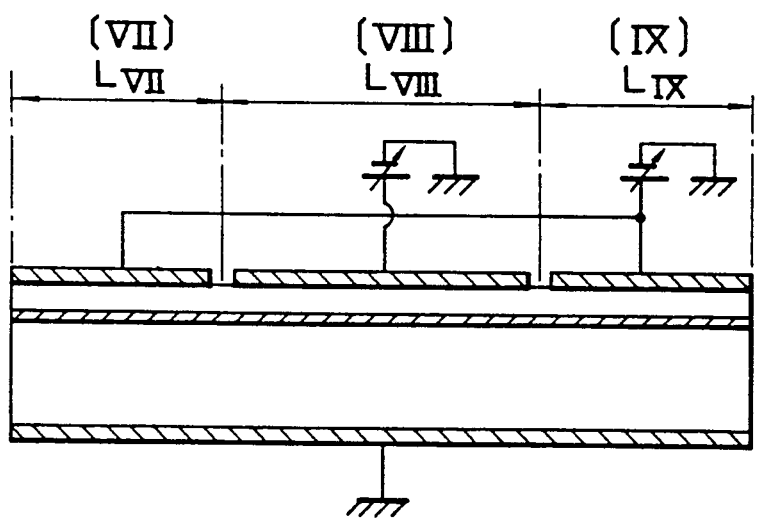

FIG. 13 shows an embodiment in which three electrodes are separately formed in the direction of resonance. However, the electrodes on the forward end surface side and the rearward end surface side are short-circuited and application is possible at equal carrier densities. Therefore, these electrodes can be regarded as two areas, i.e., area [VII] and area [IX]+[VIII].

If during non-uniform application, the areas [VII] and [IX] are used as the loss areas and the area [VIII] is used as the gain area, the wavelength can be varied without so much increasing the density of light on the end surfaces and therefore, it becomes possible to make the output higher.

Besides this, various electrode constructions for applying the electric current uniformly or non-uniformly in the direction of resonance are conceivable, but basically, as the degree of non-uniformity increases, the oscillation wavelength becomes longer.

Figure 14:
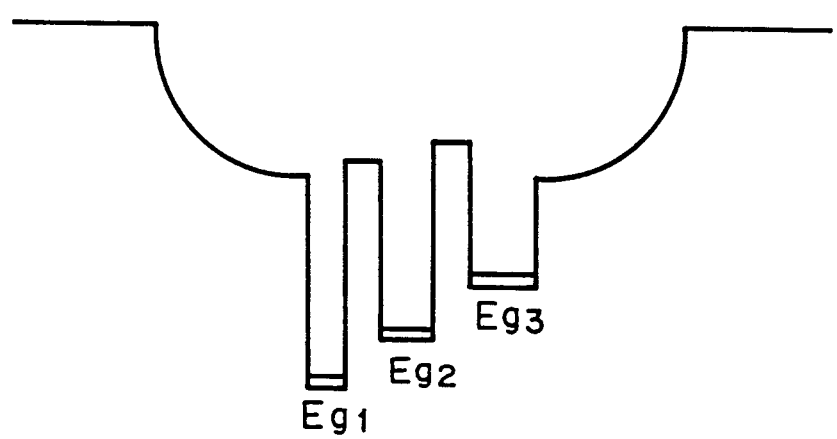
FIGS. 14 and 15 are energy band representations showing further embodiments of the present invention.

As still another embodiment of the present invention, the energy band representation of a transmission band when the active layer is constructed of three different quantum well layers is shown in FIG. 14.

Energy gaps corresponding to the respective wells are $E_{g1}$, $E_{g2}$ and $E_{g3}$, and $E_{g1} < E_{g2} < E_{g3}$.

If the present invention is applied and the end surface loss $$\frac{1}{2L} \ln \frac{1}{Rf \cdot Rb}$$

in the resonator is increased by making the length L of the resonator or the end surface reflectances Rf and Rb small, a wavelength corresponding to $E_{g3}$ is oscillated during uniform application. If an electric current is non-uniformly applied to this laser, the wavelength will become longer, and longer from a wavelength corresponding to $E_{g3}$ to a wavelength corresponding to $E_{g2}$, and further to a wavelength corresponding to $E_{g1}$. The variable width of the wavelength can be made as great as compared with the case of two well layers.

Figure 15:
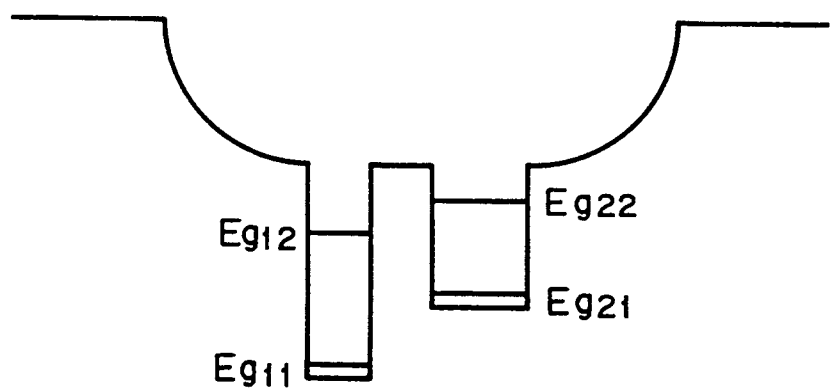

FIG. 15 is an energy band representation of a transmission band when the active layer comprises two different quantum well layers and each high-degree level is present.

When the energy gap of $n=1$ level and the energy gap of $n=2$ level of one quantum well layer are $E_{g11}$ and $E_{g12}$, respectively, and the energy gap of $n=1$ level and the energy gap of $n=2$ level of the other quantum well layer are $E_{g21}$ and $E_{g22}$, respectively, $E_{g11} < E_{g21} < E_{g12} < E_{g22}$ in this embodiment.

Again in such a case, the present invention is effective, and by suitably setting the end surface loss $$\frac{1}{2L} \ln \frac{1}{Rf \cdot Rb}$$

and making the application of an electric current uniform and non-uniform in the direction of resonance, the wavelength varying operation between the wavelengths corresponding to the adjacent energy gaps, e.g. $E_{g21} - E_{g12}$, becomes possible.

Here, if the end surface loss is made great so that $E_{g22}$ may be oscillated during uniform application the oscillation wavelength varies to wavelengths corresponding to $E_{g22} \rightarrow E_{g12} \rightarrow E_{g21} \rightarrow E_{g11}$ as the non-uniformity is increased.

In the above-described embodiments, the ridge waveguide type structure is used as the cross-section structure perpendicular to the direction of resonance of the laser, but the present invention is also effective in both of the gain waveguide type structure such as the electrode stripe type structure and the refractive index waveguide type structure such as the embedded type structure. Also, the substrate may be of n type, p type or semi-insulative if a laser structure is formed therein, and use can also be made of a laser structure of the lateral application type or the like.

Further, a semiconductor laser element of AlGaAs line has been shown as the aforedescribed embodiment, but the present invention is applicable in a laser element of any material such as InGaAaP or AlGaInP.

Furthermore, the laser element of the present invention can also be used as a light amplifier of high efficiency which operates in a wide wavelength range.

That is, an electric current slightly smaller than the threshold current for oscillating the laser is applied into each electrode of the laser element of the present invention so that the gain may be positive in a wide wavelength range. A light of a predetermined wavelength is made to enter the interior of the resonator of said element from outside and is coupled thereto.

Methods of making a light enter the interior of the resonator and coupling it thereto include a method of making a light enter through one end surface of the element, and a method of making a light enter in a lateral direction perpendicularly to the direction of resonance or from above the element.

If the light of a predetermined wavelength is thus made to enter the resonator, a light having the same wavelength can be made to emerge from the end surface thereof.

The laser element of the present invention can also be used as a light wavelength converter of high efficiency having the wavelength varying function in a wide wavelength range. That is, an electric current slightly smaller than the threshold current value for which a light of a desired wavelength is oscillated is applied in advance into each electrode of the laser element of the present invention. If a certain light is made to enter the interior of the resonator of the element from outside and is coupled thereto, a light of a desired wavelength controlled by the electric current applied to the element can emerge from the end surface thereof.

In the present invention, the variable range of the desired wavelength made to emerge is wide and can be biased by controlling the degree of non-uniformity of the poured-in electric current in the direction of resonance and therefore, it is easy to vary the wavelength.

Where the semiconductor laser element of the present invention is used as a light amplifier or a light wavelength converter, it is better to provide a non-reflecting coating on the end surfaces of the laser element.

The present invention permits various applications, besides the embodiments described above. The present invention covers all these applications without departing from the scope of the invention as defined in the appended claims.

What is claimed is:

1. A semiconductor laser element selectively emitting lights differing in corresponding quantized energy from each other, comprising:
   a substrate;
   a laser resonator provided on said substrate and having end surfaces opposed to each other, said resonator comprising semiconductor layers including an active layer of quantum well structure and laminated on said substrate; and
   a plurality of electrodes juxtaposed in the direction of resonance of said resonator, said electrodes independently applying an electric current to said active layer,
   wherein a bias voltage is applied in the direction of resonance to each of said plurality of electrodes,
   wherein the end surface loss of said resonator is set so that a light corresponding to greater quantized energy may be oscillated when electric currents are applied at equal densities from said plurality of electrodes to said active layer, and
   wherein a light corresponding to small requantized energy is oscillated when electric currents are applied at different densities from said plurality of electrodes to said active layer.

2. A semiconductor laser element according to claim 1, further comprising a reflection preventing layer provided on at least one end surface of said resonator.

3. A semiconductor laser element according to claim 1, further comprising a power source for supplying the electric current to said plurality of electrodes.

4. A semiconductor laser element according to claim 1, wherein said active layer comprises a single quantum well layer having a plurality of energy levels.

5. A semiconductor laser element according to claim 4, wherein said active layer furthers comprises separate confinement structure layers having said quantum well layer sandwiched therebetween.

6. A semiconductor laser element according to claim 1, wherein said active layer comprises a plurality of quantum well layers and a barrier layer provided between said quantum well layers.

7. A semiconductor laser element according to claim 6, wherein said quantum well layers differ in composition and thickness from each other.

8. A semiconductor laser element according to claim 6, wherein said active layer further comprises separate confinement structure layers having said quantum well layers and said barrier layer sandwiched therebetween.

9. A semiconductor laser element selectively emitting lights differing in corresponding quantized energy from each other, comprising:
   a substrate;
   a laser resonator provided on said substrate and having end surfaces opposed to each other, said resonator comprising semiconductor layers including an active layer of quantum well structure and laminated on said substrate; and
   a plurality of electrodes juxtaposed in the direction of resonance of said resonator, said electrodes independently applying an electric current to said active layer,
   wherein said resonator has a ridge portion extending in the direction of resonance,
   wherein the end surface loss of said resonator is set so that a light corresponding to greater quantized energy may be oscillated when electric currents are applied at equal densities from said plurality of electrodes to said active layer, and
   wherein a light corresponding to smaller quantized energy is oscillated when electric currents are poured at different densities from said plurality of electrodes into said active layer.

10. A semiconductor laser element according to claim 1, wherein said substrate and said semiconductor layers are materials selected from the group consisting of GaAs and AlGaAs.

11. A semiconductor laser element selectively emitting lights differing in corresponding quantized energy from each other, comprising:
    a substrate;
    a laser resonator provided on said substrate and having end surfaces opposed to each other, said resonator comprising semiconductor layers including an active layer of quantum well structure and laminated on said substrate;
    a plurality of electrodes juxtaposed in the direction of resonance of said resonator, said electrodes independently applying an electric current to said active layer, wherein a bias voltage is applied in the direction of resonance to each of said plurality of electrodes; and
    a reflection preventing layer provided on at least one end surface of said resonator, said reflection preventing layer reducing the reflectances of the end surfaces so that a light corresponding to greater quantized energy may be oscillated when electric currents are applied at equal densities from said plurality of electrodes into said active layer and that a light corresponding to smaller quantized energy may be oscillated when electric currents are applied at different densities form said plurality of electrodes into said active layer.

12. A semiconductor laser element according to claim 11, further comprising a power source for supplying the electric current to said plurality of electrodes.

13. A semiconductor laser element according to claim 11, wherein said active layer comprises a single quantum well layer having a plurality of energy levels.

14. A semiconductor laser element according to claim 13, wherein said active layer further comprises separate confinement structure layers having said quantum well layer sandwiched therebetween.

15. A semiconductor laser element according to claim 11, wherein said active layer comprises a plurality of quantum well layers and a barrier layer provided between said quantum well layers.

16. A semiconductor laser element according to claim 15, wherein said quantum well layers differ in composition and thickness from each other.

17. A semiconductor laser element according to claim 15, wherein said active layer further comprises separate confinement structure layers having said quantum well layers and said barrier layer sandwiched therebetween.

18. A semiconductor laser element selectively emitting lights differing in corresponding quantized energy from each other, comprising:
    a substrate;
    a laser resonator provided on said substrate and having end surfaces opposed to each other, said resonator comprising semiconductor layers including an active layer of quantum well structure and laminated on said substrate;
    a plurality of electrodes juxtaposed in the direction of resonance of said resonator, said electrodes independently applying an electric current to said active layer, wherein said resonator has a ridge portion extending in the direction of resonance; and
a reflection preventing layer provided on at least one end surface of said resonator, said reflection preventing layer reducing the reflectances of the end surfaces so that a light corresponding to greater quantized energy may be oscillated when electric currents are applied at equal densities from said plurality of electrodes into said active layer and that a light corresponding to smaller quantized energy may be oscillated when electric currents are applied at different densities form said plurality of electrodes into said active layer.

19. A semiconductor laser element according to claim 11, wherein said substrate and said semiconductor layers are materials selected from the group consisting of GaAs and AlGaAs.

20. A semiconductor laser element selectively emitting lights differing in corresponding quantized energy from each other, comprising:
a substrate;
a laser resonator provided on said substrate and having end surfaces opposed to each other, said resonator comprising semiconductor layers including an active layer of quantum well structure and laminated on said substrate, said resonator being divided into a gain area, a loss area and a regulation area in the direction of resonance; and
first, second and third electrodes provided correspondingly to said gain area, said loss area and said regulation area, respectively, said electrodes independently applying an electric current into said active layer;
the end surface loss of said resonator being set so that a light corresponding to greater quantized energy may be oscillated when electric currents are applied at equal densities form said first, second and third electrodes into said active layer and that a light corresponding to smaller quantized energy may be oscillated when electric currents are applied at different densities from said first, second and third electrodes into said active layer.

21. A semiconductor laser element according to claim 20, wherein the length of said third electrode in the direction of resonance is greater than the lengths of said first and second electrodes.

22. A semiconductor laser element according to claim 20, further comprising a reflection preventing layer provided on at least one end surface of said resonator.

23. A semiconductor laser element according to claim 20, further comprising a power source for supplying the electric current to said first, second and third electrodes.

24. A semiconductor laser element according to claim 20, wherein said active layer comprises a single quantum well layer having a plurality of energy levels.

25. A semiconductor laser element according to claim 24, wherein said active layer further comprises separate confinement structure layers having said quantum well layer sandwiched therebetween.

26. A semiconductor laser element according to claim 20, wherein said active layer comprises a plurality of quantum well layers and a barrier layer provided between said quantum well layers.

27. A semiconductor laser element according to claim 26, wherein said quantum well layers differ in composition and thickness from each other.

28. A semiconductor laser element according to claim 26, wherein said active layer further comprises separate confinement structure layers having said quantum well layers and said barrier layer sandwiched therebetween.

29. A semiconductor laser element according to claim 20, wherein said resonator has a ridge portion extending in the direction of resonance.

30. A semiconductor laser element according to claim 20, wherein said substrate and said semiconductor layers are materials selected from the group consisting of GaAs AlGaAs.

31. A semiconductor laser element selectively emitting lights differing in corresponding quantized energy from each other, comprising:
a substrate;
a laser resonator provided on said substrate and having end surfaces opposed to each other, said resonator comprising semiconductor layers including an active layer of quantum well structure and laminated on said substrate, said resonator being divided into a gain area, a loss area and a regulation area in the direction of resonance;
first, second and third electrodes provided correspondingly to said gain area, said loss area and said regulation area, respectively, said electrodes independently applying an electric current into said active layer; and
a reflection preventing layer provided on at least one end surface of said resonator, said reflection preventing layer reducing the reflectance of the end surface so that a light corresponding to greater quantized energy may be oscillated when electric currents are applied at equal densities from said first, second and third electrodes into said active layer and that a light corresponding to small quantized energy may be oscillated when electric currents are applied at different densities from said first, second and third electrodes into said active layer.

32. A semiconductor laser element according to claim 31, wherein the length of said third electrode in the direction of resonance is greater than the lengths of said first and second electrodes.

33. A semiconductor laser element according to claim 31, further comprising a power source for supplying the electric current to said first second and third electrodes.

34. A semiconductor laser element according to claim 31, wherein said active layer comprises a single quantum well layer having a plurality of energy levels.

35. A semiconductor laser element according to claim 34, wherein said active layer further comprises separate confinement structure layers having said quantum well layer sandwiched therebetween.

36. A semiconductor laser element according to claim 31, wherein said active layer comprises a plurality of quantum well layers and a barrier layer provided between said quantum well layers.

37. A semiconductor laser element according to claim 36, wherein said quantum well layers differ in composition and thickness from each other.

38. A semiconductor laser element according to claim 36, wherein said active layer further comprises separate confinement structure layers having said quantum well layers and said barrier layer sandwiched therebetween.

39. A semiconductor laser element according to claim 31, wherein said resonator has a ridge portion extending in the direction of resonance.

40. A semiconductor laser element according to claim 31, wherein said substrate and said semiconductor layers are materials selected from the group consisting of GaAs and AlGaAs.

* * * * *

UNITED STATES PATENT AND TRADEMARK OFFICE
CERTIFICATE OF CORRECTION

PATENT NO. : 5,060,235
DATED : October 22, 1991
INVENTOR(S) : SOTOMITSU IKEDA

Page 1 of 2

It is certified that error appears in the above-identified patent and that said Letters Patent is hereby corrected as shown below:

COLUMN 3

Line 53, "of analyzed" should read --is analyzed--.

COLUMN 11

Line 6, "are" should read --area--.
Line 67, "uniform" should read --uniform application--.

COLUMN 17

Line 35, "furthers" should read --further--.

COLUMN 18

Line 33, "form" should read --from--.

COLUMN 19

Line 12, "form" should read --from--.

UNITED STATES PATENT AND TRADEMARK OFFICE
CERTIFICATE OF CORRECTION

PATENT NO. : 5,060,235

DATED : October 22, 1991

INVENTOR(S) : SOTOMITSU IKEDA

It is certified that error appears in the above-identified patent and that said Letters Patent is hereby corrected as shown below:

COLUMN 20

Line 9, "GaAs" should read --GaAs and--.
Line 43, "first" should read --first,--.

Signed and Sealed this

Thirteenth Day of July, 1993

Attest:

MICHAEL K. KIRK

Attesting Officer

Acting Commissioner of Patents and Trademarks